(12) United States Patent
Ke et al.

(10) Patent No.: US 12,494,460 B2
(45) Date of Patent: Dec. 9, 2025

(54) ELECTRONIC PACKAGE AND MANUFACTURING METHOD THEREOF

(71) Applicant: SILICONWARE PRECISION INDUSTRIES CO., LTD., Taichung (TW)

(72) Inventors: Chung-Yu Ke, Taichung (TW); Liang-Pin Chen, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 633 days.

(21) Appl. No.: 17/975,455

(22) Filed: Oct. 27, 2022

(65) Prior Publication Data
US 2024/0072019 A1 Feb. 29, 2024

(30) Foreign Application Priority Data
Aug. 31, 2022 (TW) ................... 111132958

(51) Int. Cl.
*H01L 25/10* (2006.01)
*H01L 23/00* (2006.01)
*H01L 25/00* (2006.01)

(52) U.S. Cl.
CPC ............ *H01L 25/105* (2013.01); *H01L 24/16* (2013.01); *H01L 24/24* (2013.01); *H01L 25/50* (2013.01); *H01L 24/32* (2013.01); *H01L 24/73* (2013.01); *H01L 2224/16227* (2013.01); *H01L 2224/24137* (2013.01); *H01L 2224/244* (2013.01); *H01L 2224/32225* (2013.01); *H01L 2224/73204* (2013.01); *H01L 2224/73259* (2013.01); *H01L 2224/73267* (2013.01); *H01L 2225/1035* (2013.01)

(58) Field of Classification Search
CPC ........ H01L 25/105; H01L 24/16; H01L 24/24
See application file for complete search history.

(56) References Cited

U.S. PATENT DOCUMENTS

| | | | | |
|---|---|---|---|---|
| 9,224,647 B2* | 12/2015 | Koo | ........................ | H01L 25/50 |
| 10,504,835 B1* | 12/2019 | Wang | ................ | H01L 23/53238 |
| 10,727,198 B2* | 7/2020 | Hsu | ..................... | H01L 23/3107 |
| 11,127,699 B2* | 9/2021 | Lin | ................... | H01L 23/49822 |
| 12,132,024 B2* | 10/2024 | Tsai | ................... | H01L 23/5385 |

(Continued)

*Primary Examiner* — Errol V Fernandes
(74) *Attorney, Agent, or Firm* — Studebaker Brackett PLLC

(57) ABSTRACT

An electronic package is provided, in which an electronic module and a plurality of conductive pillars are embedded in an encapsulation layer, and a circuit structure is formed on the encapsulation layer, where the electronic module includes a carrier structure having conductive vias and at least a first electronic element disposed on the carrier structure. The first electronic element has a plurality of conductors in a form of conductive through-silicon vias, and at least a second electronic element is disposed on the circuit structure. Therefore, the design of the electronic module can reduce the layout area occupied by the electronic element on a surface of a packaging zone of the circuit structure, such that other functional elements can be added to the electronic package according to requirements, and the electronic package can improve functional requirements of the end product.

20 Claims, 4 Drawing Sheets

(56) References Cited

U.S. PATENT DOCUMENTS

| | | | |
|---|---|---|---|
| 2013/0093100 A1* | 4/2013 | Shariff | H01L 25/0657 |
| | | | 257/E21.597 |
| 2013/0105213 A1* | 5/2013 | Hu | H05K 1/142 |
| | | | 174/266 |
| 2020/0328161 A1* | 10/2020 | Lin | H01L 21/4853 |
| 2021/0272930 A1* | 9/2021 | Choi | H01L 23/5384 |
| 2023/0065615 A1* | 3/2023 | Kung | H01L 23/49827 |
| 2023/0065941 A1* | 3/2023 | Tsai | H01L 21/568 |
| 2023/0071812 A1* | 3/2023 | Jang | H01L 25/0657 |

* cited by examiner

ELECTRONIC PACKAGE AND MANUFACTURING METHOD THEREOF

RELATED APPLICATIONS

This application claims priority to Taiwan Application Serial No. 111132958, filed on Aug. 31, 2022.

BACKGROUND OF THE INVENTION

1. Technical Field

The present disclosure relates to a semiconductor device, and more particularly, to an electronic package with conductive through-silicon vias (TSVs) and a manufacturing method thereof.

2. Description of Related Art

In order to ensure the continued miniaturization and versatility of electronic products and communication equipment, semiconductor packages need to be miniaturized in size to facilitate multi-pin connections and have high functionality. For example, in the advanced packaging process, packaging types such as 2.5D packaging process, fan-out (FO) routing/wiring process, etc. are commonly used, and the FO routing process has the advantages of low cost and many material suppliers compared with the 2.5D packaging process.

FIG. 1A is a schematic cross-sectional view of a conventional semiconductor package 1. In the semiconductor package 1, a first semiconductor chip 11 and a plurality of conductive pillars 13 are disposed on a substrate structure 14 having a circuit layer 140 (e.g., the first semiconductor chip 11 is disposed on the substrate structure 14 via an adhesive 12), and the conductive pillars 13 are electrically connected to the circuit layer 140. Then, the first semiconductor chip 11 and the conductive pillars 13 are covered by an encapsulation layer 15, and a circuit structure 16 is formed on the encapsulation layer 15 to electrically connect to the first semiconductor chip 11 and the conductive pillars 13, so that a plurality of second semiconductor chips 17 are disposed on and electrically connected to the circuit structure 16, and the second semiconductor chips 17 are then covered with a packaging layer 18. Afterwards, the substrate structure 14 can be disposed onto a package substrate 10 via a plurality of solder balls 19.

However, in the conventional semiconductor package 1, the second semiconductor chips 17 occupy too much layout area on the surface of the packaging zone of the circuit structure 16 (the layout area of the packaging layer 18) as shown in FIG. 1B, so that it is difficult for the semiconductor package 1 to add other functional elements, resulting in the inability to improve the functional requirements of the end product.

On the other hand, if functional elements with other functions (such as the antenna function) are required to be added, then the layout area of the circuit structure 16 needs to be enlarged or expanded, so that it is hard to meet the requirements of the end product for light, thin, short, low power consumption and high electrical performance.

Therefore, there is a need for a solution that addresses the aforementioned shortcomings in the prior art. The present invention fulfills these needs and provides other related advantages.

SUMMARY OF THE INVENTION

In view of the aforementioned shortcomings of the prior art, the present disclosure provides an electronic package, which comprises: an encapsulation layer having a first surface and a second surface opposing the first surface; an electronic module embedded in the encapsulation layer and comprising a carrier structure and at least a first electronic element disposed on the carrier structure, wherein the first electronic element has a plurality of conductors penetrating through a surface of the first electronic element, wherein the carrier structure has a first side, a second side opposing the first side and a plurality of conductive vias communicating the first side and the second side, and wherein the first electronic element is disposed on the first side of the carrier structure and electrically connected to the plurality of conductive vias; a plurality of conductive pillars embedded in the encapsulation layer; a first circuit structure bonded with the first surface of the encapsulation layer and electrically connected to the plurality of conductive vias and the plurality of conductive pillars; a second circuit structure bonded with the second surface of the encapsulation layer and electrically connected to the plurality of conductive pillars and the plurality of conductors; and at least a second electronic element disposed on and electrically connected to the second circuit structure.

The present disclosure further provides a method of manufacturing an electronic package, the method comprises: providing an electronic module comprising a carrier structure and at least a first electronic element disposed on the carrier structure, wherein the first electronic element has a plurality of conductors penetrating through a surface of the first electronic element, wherein the carrier structure has a first side and a second side opposing the first side and a plurality of conductive vias communicating the first side and the second side, and wherein the first electronic element is disposed on the first side of the carrier structure and electrically connected to the plurality of conductive vias; disposing the electronic module on a first circuit structure formed with a plurality of conductive pillars, wherein the first circuit structure is electrically connected to the plurality of conductive vias and the plurality of conductive pillars; forming an encapsulation layer on the first circuit structure to cover the electronic module and the plurality of conductive pillars; forming a second circuit structure on the encapsulation layer, wherein the second circuit structure is electrically connected to the plurality of conductive pillars and the plurality of conductors; and disposing at least a second electronic element on the second circuit structure, wherein the second electronic element is electrically connected to the second circuit structure.

In the aforementioned electronic package and method, the present disclosure further comprises forming a routing structure on the first side of the carrier structure, the routing structure being electrically connected to the plurality of conductive vias, wherein the first electronic element is disposed on and electrically connected to the routing structure.

In the aforementioned electronic package and method, the first electronic element is disposed on the carrier structure via a plurality of conductive bumps.

In the aforementioned electronic package and method, the surface of the first electronic element and end surfaces of the plurality of conductors are flush with a surface of the encapsulation layer.

In the aforementioned electronic package and method, the plurality of conductive pillars have end surfaces flush with a surface of the encapsulation layer.

In the aforementioned electronic package and method, the first circuit structure is free from being directly electrically connected to the first electronic element.

In the aforementioned electronic package and method, the second electronic element is disposed on the second circuit structure via a plurality of conductive bumps.

In the aforementioned electronic package and method, a plurality of the second electronic elements are disposed on the second circuit structure along a surface of the second circuit structure.

In the aforementioned electronic package and method, the present disclosure further comprises covering the second electronic element by a packaging layer.

In the aforementioned electronic package and method, the present disclosure further comprises forming a plurality of conductive elements on the first circuit structure.

As can be understood from the above, in the electronic package and manufacturing method thereof according to the present disclosure, the design of the electronic module enables the first electronic element to be embedded in the encapsulation layer, so as to reduce the layout area occupied by the second electronic element on the surface of the packaging zone of the second circuit structure, such that other functional elements can be added to the electronic package according to requirements. Therefore, compared with the prior art, the electronic package of the present disclosure can improve the functional requirements of the end product.

On the other hand, if the electronic package of the present disclosure needs to add functional elements with other functions, the requirements of the end product for light, thin, short, low power consumption and high electrical performance can still be met since there is no need to increase the layout area of the second circuit structure.

Other features and advantages of the present invention will become apparent from the following more detailed description, taken in conjunction with the accompanying drawings, which illustrate, by way of example, the principles of the invention.

BRIEF DESCRIPTION OF THE DRAWINGS

The accompanying drawings illustrate the invention. In such drawings.

DETAILED DESCRIPTION OF THE PREFERRED EMBODIMENTS

Figure 1A:
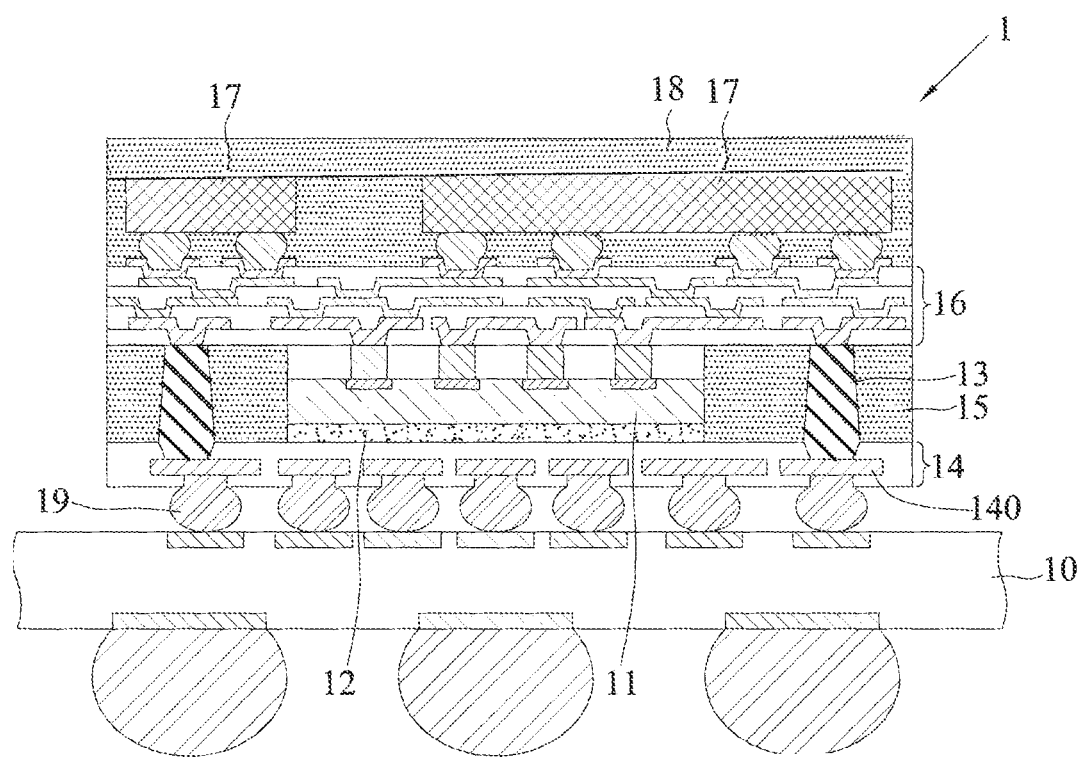
FIG. 1A is a schematic cross-sectional view of a conventional semiconductor package.
Figure 1B:
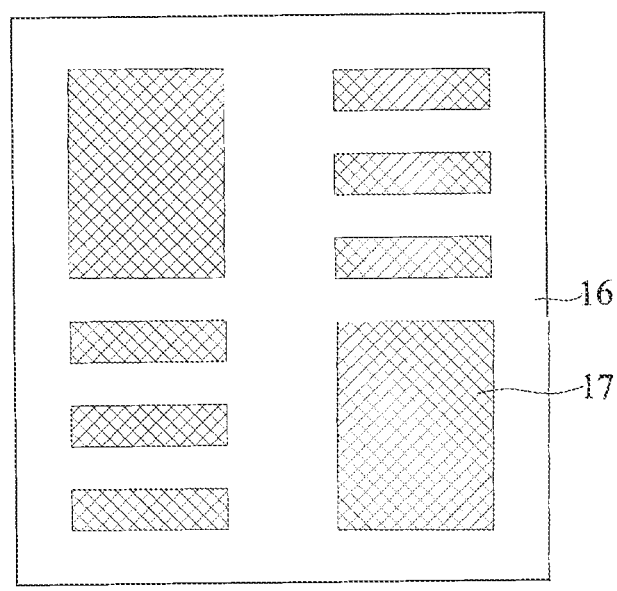
FIG. 1B is a partial top plan view of FIG. 1A.

Implementations of the present disclosure are described below by embodiments. Other advantages and technical effects of the present disclosure can be readily understood by one of ordinary skill in the art upon reading the disclosure of this specification.

It should be noted that the structures, ratios, sizes shown in the drawings appended to this specification are provided in conjunction with the disclosure of this specification in order to facilitate understanding by those skilled in the art. They are not meant, in any ways, to limit the implementations of the present disclosure, and therefore have no substantial technical meaning. Without influencing the effects created and objectives achieved by the present disclosure, any modifications, changes or adjustments to the structures, ratios or sizes are construed as falling within the scope covered by the technical contents disclosed herein. Meanwhile, terms such as "on," "above," "first," "second," "one," "a," "an," and the like, are for illustrative purposes, and are not meant to limit the scope implementable by the present disclosure. Any changes or adjustments made to the relative relationships, without substantially modifying the technical contents, are also to be construed as within the scope implementable by the present disclosure.

FIG. 2A to FIG. 2E are schematic cross-sectional views illustrating a method of manufacturing an electronic package 2 according to the present disclosure.

Figure 2A:
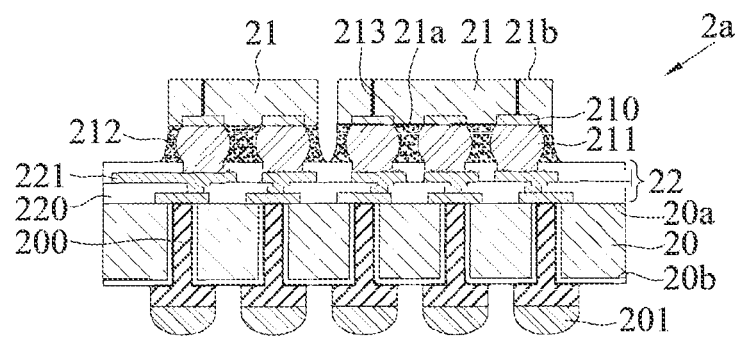
FIG. 2A to FIG. 2E are schematic cross-sectional views illustrating a method of manufacturing an electronic package according to the present disclosure.

As shown in FIG. 2A, an electronic module 2a is provided and comprises a carrier structure 20 and at least one first electronic element 21 stacked on the carrier structure 20.

The carrier structure 20 has a board containing silicon, such as a through-silicon interposer (TSI) or a glass substrate, and the board is arranged with conductive circuits.

In an embodiment, the carrier structure 20 is a TSI and has a first side 20a and a second side 20b opposing the first side 20a, and a plurality of conductive vias 200 communicating the first side 20a and the second side 20b and served as conductive circuits. The conductive vias 200 are conductive through-silicon vias (TSVs), wherein each of the conductive vias 200 is composed of a copper pillar and an insulating material surrounding the copper pillar. However, there are many ways to fabricate the conductive vias 200, and the present disclosure is not limited to as such.

Furthermore, the first side 20a of the carrier structure 20 can be used as a die placement side for arranging the first electronic element 21, and the second side 20b of the carrier structure 20 can be used as a switching side.

Also, a routing process can be selectively performed on the first side 20a of the carrier structure 20 to form a routing structure 22 to be used as a conductive circuit. For example, the routing structure 22 comprises at least one dielectric layer 220 and at least one redistribution layer (RDL) 221 bonded with the dielectric layer 220, wherein the redistribution layer 221 is electrically connected to the plurality of conductive vias 200.

On the other hands, a plurality of conductive elements 201 may be formed on the second side 20b of the carrier structure 20, so that the plurality of conductive elements 201 are bonded onto end surfaces of the plurality of conductive vias 200. For example, the plurality of conductive elements 201 include metal pillars (such as copper pillars) and/or solder material, and an under bump metallurgy (UBM) layer may be formed between the plurality of conductive elements 201 and the plurality of conductive vias 200, wherein the structure and the material of the UBM layer are various, and the present disclosure is not limited to as such. It should be understood that a routing structure (not shown) can also be formed on the second side 20b of the carrier structure 20 to arrange the plurality of conductive elements 201.

The first electronic element 21 is disposed on the first side 20a of the carrier structure 20 and electrically connected to the plurality of conductive vias 200.

In an embodiment, the first electronic element 21 is an active element, a passive element, or a combination of the active element and the passive element, etc., wherein the active element may be a semiconductor chip, and the passive element may be a resistor, a capacitor, or an inductor. For example, the first electronic element 21 is a semiconductor chip, such as a graphics processing unit (GPU), a system on a chip (SoC), or a high bandwidth memory (HBM), and the first electronic element 21 has a first active surface 21a and a first inactive surface 21b opposing the first active surface 21a. A plurality of first electrode pads 210 are formed on the first active surface 21a, so that the first electrode pads 210 are disposed on the routing structure 22 in a flip-chip manner via a plurality of first conductive bumps 211 such as solder material and are electrically connected to the redistribution layer 221, and then the first conductive bumps 211 are covered by an underfill 212.

Moreover, the first electronic element 21 further has at least one conductor 213 communicating the first inactive surface 21b and electrically connected to the first electrode pad 210. For example, the conductor 213 is in a column shape, such as in the form of a conductive through-silicon via (TSV).

Figure 2B:
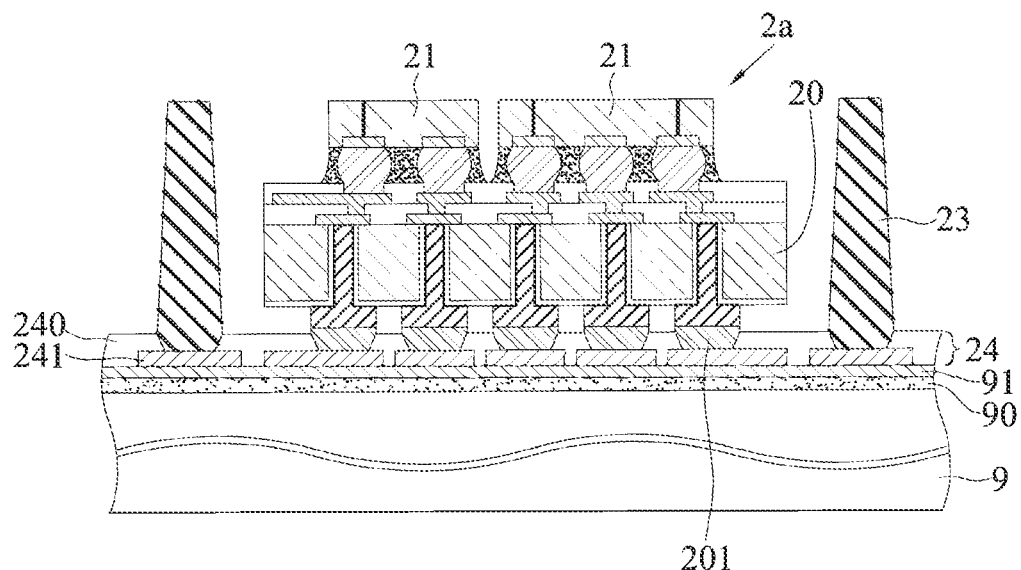

As shown in FIG. 2B, the electronic module 2a is disposed on a first circuit structure 24 on a carrier 9, and a plurality of conductive pillars 23 are disposed on the first circuit structure 24.

The carrier 9 is, for example, a board made of semiconductor material (such as silicon or glass), on which a release layer 90 and a metal layer 91 made of such as titanium/copper are sequentially formed by, for example, coating, so that the first circuit structure 24 is formed on the metal layer 91.

The first circuit structure 24 comprises at least one first insulating layer 240 and at least one first circuit layer 241 bonded with the first insulating layer 240. For example, the material for forming the first circuit layer 241 is copper, and the material for forming the first insulating layer 240 is polybenzoxazole (PBO), polyimide (PI), prepreg (PP), or other dielectric materials, wherein the first circuit layer 241 and the first insulating layer 240 can be formed by a redistribution layer (RDL) process.

In an embodiment, the electronic module 2a is disposed on the first circuit structure 24 via the plurality of conductive elements 201 with the carrier structure 20 thereof and is electrically connected to the first circuit layer 241, such that the first circuit structure 24 is free from being directly electrically connected to the first electronic element 21.

The plurality of conductive pillars 23 are disposed on the first circuit structure 24 and electrically connected to the first circuit layer 241.

In an embodiment, the material for forming the conductive pillars 23 is a metal material such as copper or a solder material. For example, the conductive pillars 23 are formed by electroplating on the first circuit layer 241 via exposure and development.

Figure 2C:
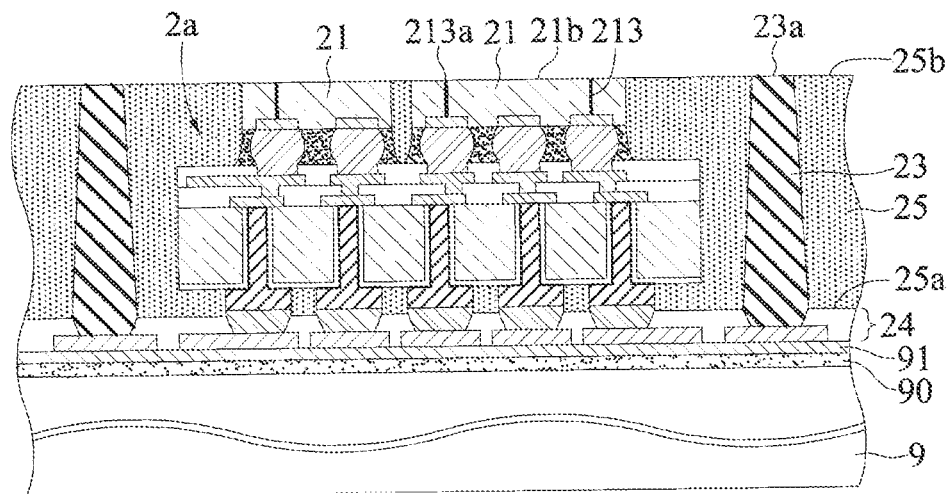

As shown in FIG. 2C, an encapsulation layer 25 is formed on the first circuit structure 24 to cover the electronic module 2a and the conductive pillars 23, wherein the encapsulation layer 25 has a first surface 25a and a second surface 25b opposing the first surface 25a, and the encapsulation layer 25 is bonded onto the first circuit structure 24 by the first surface 25a of the encapsulation layer 25, and wherein end surfaces 213a of the conductors 213 and end surfaces 23a of the conductive pillars 23 are exposed from the second surface 25b of the encapsulation layer 25.

In an embodiment, the encapsulation layer 25 is made from an insulating material such as polyimide (PI), dry film, encapsulating colloid such as epoxy resin, or molding compound. For example, the encapsulation layer 25 can be formed on the first circuit structure 24 by liquid compound, injection, lamination, or compression molding.

Further, the second surface 25b of the encapsulation layer 25 can be flush with the first inactive surface 21b of the first electronic element 21, the end surfaces 23a of the conductive pillars 23 and the end surfaces 213a of the conductors 213 by a leveling process, so that the first inactive surface 21b of the first electronic element 21, the end surfaces 23a of the conductive pillars 23 and the end surfaces 213a of the conductors 213 are exposed from the second surface 25b of the encapsulation layer 25. For example, the leveling process removes a portion of the material of each of the conductive pillars 23 and a portion of the material of the encapsulation layer 25 (even removes a portion of the material of the first electronic element 21 and a portion of the material of each of the conductors 213) by grinding.

Figure 2D:
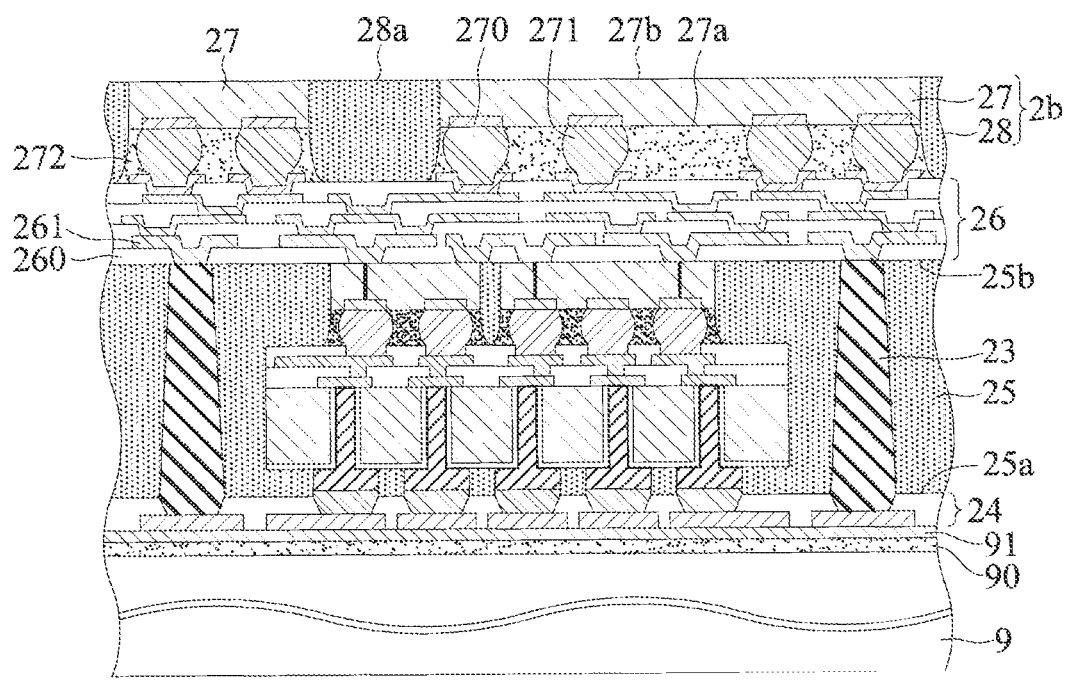

As shown in FIG. 2D, a second circuit structure 26 is formed on the second surface 25b of the encapsulation layer 25, so that the second circuit structure 26 is electrically connected to the plurality of conductive pillars 23 and the plurality of conductors 213, and then at least one second electronic element 27 is disposed on and electrically connected to the second circuit structure 26. Then, the second electronic elements 27 are covered with a packaging layer 28, such that the packaging layer 28 and the second electronic elements 27 can be regarded as a packaging module 2b.

The second circuit structure 26 comprises at least one second insulating layer 260 and at least one second circuit layer 261 bonded with the second insulating layer 260. For example, the material for forming the second circuit layer 261 is copper, and the material for forming the second insulating layer 260 is polybenzoxazole (PBO), polyimide (PI), prepreg (PP), or other dielectric materials, wherein the second circuit layer 261 and the second insulating layer 260 can be formed by a redistribution layer (RDL) process.

The second electronic element 27 is an active element, a passive element, or a combination of the active element and the passive element, wherein the active element may be a semiconductor chip, and the passive element may be a resistor, a capacitor, or an inductor.

In an embodiment, the second electronic element 27 is a semiconductor chip such as a graphics processing unit (GPU), a system on a chip (SoC), or a high bandwidth memory (HBM).

Further, the second electronic element 27 has a second active surface 27a and a second inactive surface 27b opposing the second active surface 27a. A plurality of second electrode pads 270 are formed on the second active surface 27a, so that the second electrode pads 270 are disposed on the second circuit structure 26 in a flip-chip manner via a plurality of second conductive bumps 271 such as solder material and are electrically connected to the second circuit layer 261, and then the second conductive bumps 271 are covered with an underfill 272. Alternatively, the second electronic element 27 is bonded onto the second circuit structure 26 with the second inactive surface 27b thereof, and the plurality of second electrode pads 270 are electrically connected to the second circuit layer 261 via a plurality of wires (not shown) in a wire-bonding manner. Therefore, it can be understood that there are many ways in which the second electronic element 27 can be electrically connected to the second circuit layer 261, and the present disclosure is not limited to as such.

The packaging layer 28 is formed on the second surface 25b of the encapsulation layer 25, and the packaging layer 28 is made from an insulating material such as polyimide (PI), dry film, encapsulating colloid such as epoxy resin, or molding compound. The packaging layer 28 can be formed on the second circuit structure 26 in a manner of lamination or molding. It should be understood that the material for forming the packaging layer 28 may be the same as or different from the material for forming the encapsulation layer 25.

In an embodiment, the underfill 272 is firstly formed between the second electronic element 27 and the second circuit structure 26 to cover the second conductive bumps 271, and then the packaging layer 28 is formed to cover the underfill 272 and the second electronic element 27. In other embodiments, the packaging layer 28 covers the second electronic elements 27 and the second conductive bumps 271 at the same time without using the underfill 272.

Further, a surface 28a of the packaging layer 28 can be flush with the second inactive surface 27b of the second electronic element 27 by a leveling process, so that the second inactive surface 27b of the second electronic element 27 is exposed from the surface 28a of the packaging layer 28. For example, the leveling process removes a portion of the material of the packaging layer 28 and even removes a portion of the material of the second electronic element 27 by grinding.

Figure 2E:
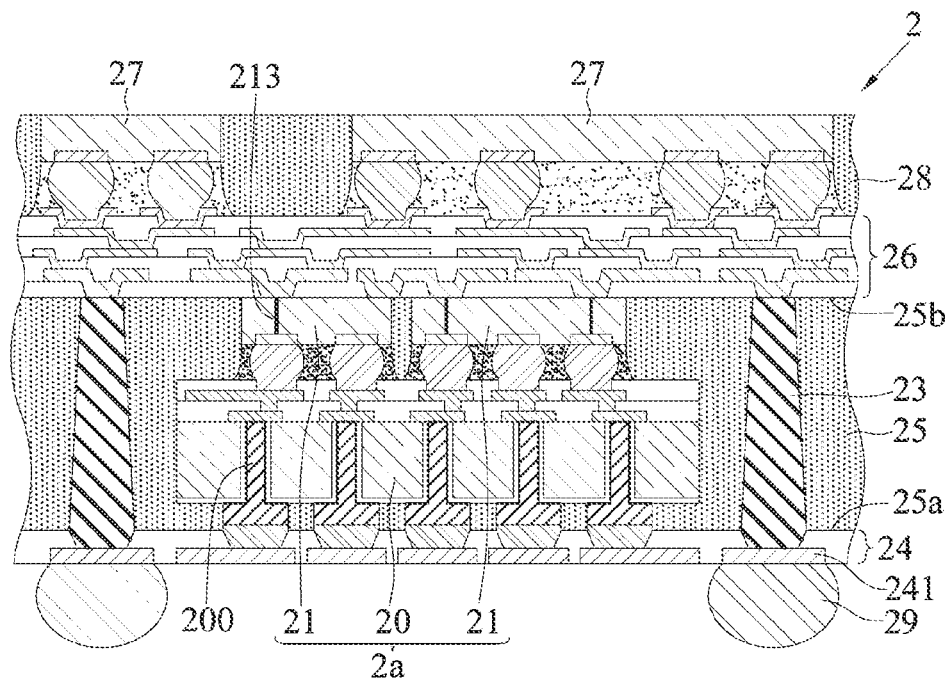

As shown in FIG. 2E, the carrier 9 and the release layer 90 thereon are removed, and then the metal layer 91 is removed to expose the first circuit structure 24. Afterwards, a plurality of conductive elements 29 such as solder balls are formed on the first circuit structure 24, so that the conductive elements 29 are electrically connected to the first circuit layer 241, thereby obtaining the electronic package 2.

Figure 2F:
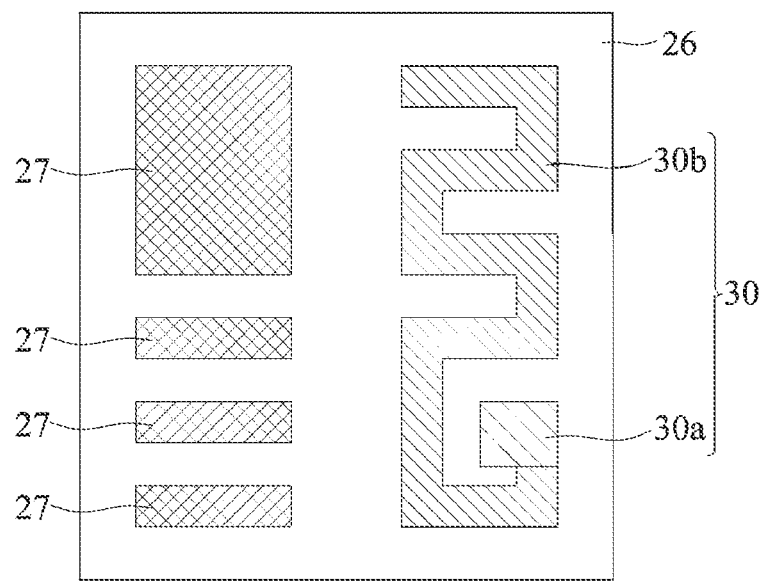
FIG. 2F is a partial top plan view of FIG. 2E.

As shown in FIG. 2F, in an embodiment, a functional element 30 such as a radio-frequency (RF) chip 30a or an antenna structure 30b may be disposed on the second circuit structure 26.

In the subsequent process, the electronic package 2 can be disposed on a package substrate (not shown) or a circuit board (not shown) via the conductive elements 29.

Therefore, in the manufacturing method of the present disclosure, the design of the electronic module 2a enables the first electronic element 21 to be embedded in the encapsulation layer 25, so as to reduce the layout area occupied by the second electronic element 27 on the surface of the packaging zone (a layout zone of the packaging layer 28) of the second circuit structure 26, such that other functional elements 30 can be added to the electronic package 2 according to requirements. Therefore, compared with the prior art, the electronic package 2 of the present disclosure can improve the functional requirements of the end product.

On the other hand, if the electronic package 2 of the present disclosure needs to add the functional element 30 with other functions (e.g., antenna function), the requirements of the end product for light, thin, short, low power consumption and high electrical performance can still be met since there is no need to increase the layout area of the second circuit structure 26.

The present disclosure further provides an electronic package 2, which comprises: an encapsulation layer 25, an electronic module 2a having a carrier structure 20 and at least one first electronic element 21, a plurality of conductive pillars 23, a first circuit structure 24, a second circuit structure 26 and at least one second electronic element 27.

The encapsulation layer 25 has a first surface 25a and a second surface 25b opposing the first surface 25a.

The electronic module 2a is embedded in the encapsulation layer 25.

The first electronic element 21 is stacked on a first side 20a of the carrier structure 20, and the first electronic element 21 has a plurality of conductors 213 in a form of conductive through-silicon vias (TSVs).

The carrier structure 20 has the first side 20a and a second side 20b opposing the first side 20a and a plurality of conductive vias 200 communicating the first side 20a and the second side 20b, such that the first electronic element 21 is electrically connected to the plurality of conductive vias 200.

The plurality of conductive pillars 23 are embedded in the encapsulation layer 25.

The first circuit structure 24 is bonded with the first surface 25a of the encapsulation layer 25 and electrically connected to the plurality of conductive vias 200 and the plurality of conductive pillars 23.

The second circuit structure 26 is bonded with the second surface 25b of the encapsulation layer 25 and electrically connected to the plurality of conductive pillars 23 and the plurality of conductors 213.

The second electronic element 27 is disposed on the second circuit structure 26 and electrically connected to the second circuit structure 26.

In one embodiment, a routing structure 22 is formed on the first side 20a of the carrier structure 20 and electrically connected to the plurality of conductive vias 200, such that the first electronic element 21 is disposed on the routing structure 22 and electrically connected to the routing structure 22.

In one embodiment, the first electronic element 21 is disposed on the carrier structure 20 via a plurality of first conductive bumps 211.

In one embodiment, a first inactive surface 21b of the first electronic element 21 and end surfaces 213a of the conductors 213 are flush with the second surface 25b of the encapsulation layer 25.

In one embodiment, end surfaces 23a of the conductive pillars 23 are flush with the second surface 25b of the encapsulation layer 25.

In one embodiment, the first circuit structure 24 is free from being directly electrically connected to the first electronic element 21.

In one embodiment, the second electronic element 27 is disposed on the second circuit structure 26 via a plurality of second conductive bumps 271.

In one embodiment, a plurality of the second electronic elements 27 are disposed on the second circuit structure 26 along a horizontal surface of the second circuit structure 26.

In one embodiment, the electronic package 2 further comprises a packaging layer 28 covering the second electronic element 27.

In one embodiment, the electronic package 2 further comprises a plurality of conductive elements 29 disposed on the first circuit structure 24.

In view of the above, in the electronic package and manufacturing method thereof according to the present disclosure, the design of the electronic module enables the first electronic element to be embedded in the encapsulation layer, so as to reduce the layout area occupied by the second electronic element on the surface of the packaging zone of the second circuit structure, such that other functional elements can be added to the electronic package according to requirements. Therefore, the electronic package of the present disclosure can improve the functional requirements of the end product.

On the other hand, if the electronic package of the present disclosure needs to add functional elements with other functions, the requirements of the end product for light, thin, short, low power consumption and high electrical performance can still be met since there is no need to increase the layout area of the second circuit structure.

The above embodiments are provided for illustrating the principles of the present disclosure and its technical effect, and should not be construed as to limit the present disclosure in any way. The above embodiments can be modified by one of ordinary skill in the art without departing from the spirit and scope of the present disclosure. Therefore, the scope claimed of the present disclosure should be defined by the following claims.

What is claimed is:

1. An electronic package, comprising:
an encapsulation layer having a first surface and a second surface opposing the first surface;
an electronic module embedded in the encapsulation layer and comprising a carrier structure and at least a first electronic element disposed on the carrier structure, wherein the first electronic element has a plurality of conductors penetrating through a surface of the first electronic element, wherein the carrier structure has a first side, a second side opposing the first side and a plurality of conductive vias communicating the first side and the second side, and wherein the first electronic element is disposed on the first side of the carrier structure and electrically connected to the plurality of conductive vias;
a plurality of conductive pillars embedded in the encapsulation layer;
a first circuit structure bonded with the first surface of the encapsulation layer and electrically connected to the plurality of conductive vias and the plurality of conductive pillars;
a second circuit structure bonded with the second surface of the encapsulation layer and electrically connected to the plurality of conductive pillars and the plurality of conductors; and
at least a second electronic element disposed on and electrically connected to the second circuit structure.

2. The electronic package of claim 1, further comprising a routing structure formed on the first side of the carrier structure and electrically connected to the plurality of conductive vias, wherein the first electronic element is disposed on and electrically connected to the routing structure.

3. The electronic package of claim 1, wherein the first electronic element is disposed on the carrier structure via a plurality of conductive bumps.

4. The electronic package of claim 1, wherein the surface of the first electronic element and end surfaces of the plurality of conductors are flush with the second surface of the encapsulation layer.

5. The electronic package of claim 1, wherein the plurality of conductive pillars have end surfaces flush with the second surface of the encapsulation layer.

6. The electronic package of claim 1, wherein the first circuit structure is free from being directly electrically connected to the first electronic element.

7. The electronic package of claim 1, wherein the second electronic element is disposed on the second circuit structure via a plurality of conductive bumps.

8. The electronic package of claim 1, wherein a plurality of the second electronic elements are disposed on the second circuit structure along a surface of the second circuit structure.

9. The electronic package of claim 1, further comprising a packaging layer covering the second electronic element.

10. The electronic package of claim 1, further comprising a plurality of conductive elements disposed on the first circuit structure.

11. A method of manufacturing an electronic package, comprising:
providing an electronic module comprising a carrier structure and at least a first electronic element disposed on the carrier structure, wherein the first electronic element has a plurality of conductors penetrating through a surface of the first electronic element, wherein the carrier structure has a first side and a second side opposing the first side and a plurality of conductive vias communicating the first side and the second side, and wherein the first electronic element is disposed on the first side of the carrier structure and electrically connected to the plurality of conductive vias;
disposing the electronic module on a first circuit structure formed with a plurality of conductive pillars, wherein the first circuit structure is electrically connected to the plurality of conductive vias and the plurality of conductive pillars;
forming an encapsulation layer on the first circuit structure to cover the electronic module and the plurality of conductive pillars;
forming a second circuit structure on the encapsulation layer, wherein the second circuit structure is electrically connected to the plurality of conductive pillars and the plurality of conductors; and
disposing at least a second electronic element on the second circuit structure, wherein the second electronic element is electrically connected to the second circuit structure.

12. The method of claim 11, further comprising forming a routing structure on the first side of the carrier structure, the routing structure being electrically connected to the plurality of conductive vias, wherein the first electronic element is disposed on and electrically connected to the routing structure.

13. The method of claim 11, wherein the first electronic element is disposed on the carrier structure via a plurality of conductive bumps.

14. The method of claim 11, wherein the surface of the first electronic element and end surfaces of the plurality of conductors are flush with a surface of the encapsulation layer.

15. The method of claim 11, wherein the plurality of conductive pillars have end surfaces flush with a surface of the encapsulation layer.

16. The method of claim 11, wherein the first circuit structure is free from being directly electrically connected to the first electronic element.

17. The method of claim 11, wherein the second electronic element is disposed on the second circuit structure via a plurality of conductive bumps.

18. The method of claim 11, wherein a plurality of the second electronic elements are disposed on the second circuit structure along a surface of the second circuit structure.

19. The method of claim 11, further comprising covering the second electronic element by a packaging layer.

20. The method of claim 11, further comprising forming a plurality of conductive elements on the first circuit structure.

* * * * *